United States Patent [19]

Kuwano et al.

[11] Patent Number: 4,962,612
[45] Date of Patent: Oct. 16, 1990

[54] DECORATIVE PANEL AS CONSTRUCTION MATERIAL

[75] Inventors: Tomonori Kuwano, Chiba; Kazutoshi Omoda, Tokyo, both of Japan

[73] Assignee: Nisshin Steel Co., Ltd., Tokyo, Japan

[21] Appl. No.: 337,765

[22] PCT Filed: Apr. 22, 1988

[86] PCT No.: PCT/JP88/00398

§ 371 Date: Dec. 23, 1988

§ 102(e) Date: Dec. 23, 1988

[87] PCT Pub. No.: WO88/08473

PCT Pub. Date: Nov. 3, 1988

[30] Foreign Application Priority Data

Apr. 23, 1987 [JP] Japan .................. 62-100296

[51] Int. Cl.⁵ .................. E04B 1/38; B27K 1/00
[52] U.S. Cl. .................. 52/506; 52/588; 52/515; 52/468; 52/725; 428/653
[58] Field of Search .................. 52/506, 588, 515, 468, 52/725; 427/255, 380; 428/653, 685

[56] References Cited

U.S. PATENT DOCUMENTS

| | | |
|---|---|---|
| 640,593 | 1/1900 | Russell .................. 52/588 |
| 2,148,858 | 2/1939 | Freeman et al. .................. 52/588 |
| 3,881,880 | 5/1975 | Gomersall .................. 428/653 |
| 3,881,881 | 5/1975 | Kim .................. 428/653 |
| 3,985,916 | 10/1976 | Church et al. .................. 427/380 |
| 4,112,148 | 9/1978 | Fonzi .................. 427/255 |

*Primary Examiner*—James L. Ridgill, Jr.
*Attorney, Agent, or Firm*—Wenderoth, Lind & Ponack

[57] ABSTRACT

A decorative panel as a construction material for use in decorative finish of a building, said panel comprising a sheet of stainless steel as a substrate and a thin colored coat on at least one surface of said substrate and having one or more bent portions where it is bent at an angle of at least 90°, said colored coat consisting essentially of from 30 to 60 atomic % of titanium, from 30 to 60 atomic % of aluminum, such an amount of nitrogen that a ratio N (atomic %)/[Ti (atomic %)+Al (atomic %)] is within the range between 0.6 and 1.0 and optionally such an amount of carbon that a ratio C (atomic %)/[Ti (atomic %)+Al (atomic %)] is not greater than 0.25; said colored coat being applied onto the surface of said substrate by a sputter ion plating process, whereby nitrides and carbides of titanium and aluminum are entirely consistently formed to constitute said colored coat.

8 Claims, 5 Drawing Sheets

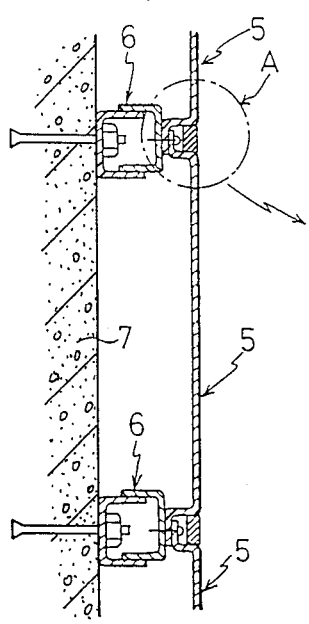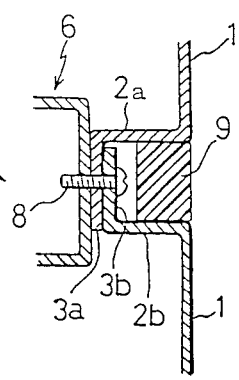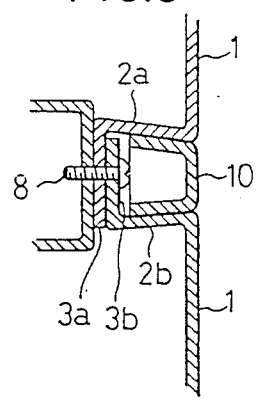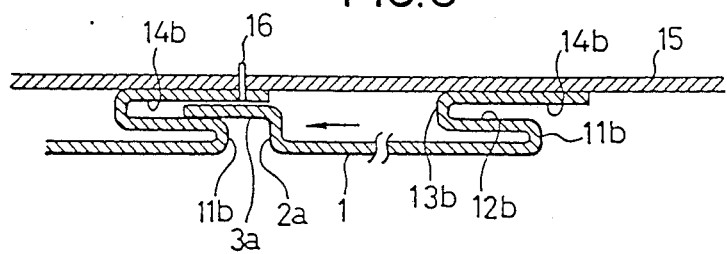

FIG.7
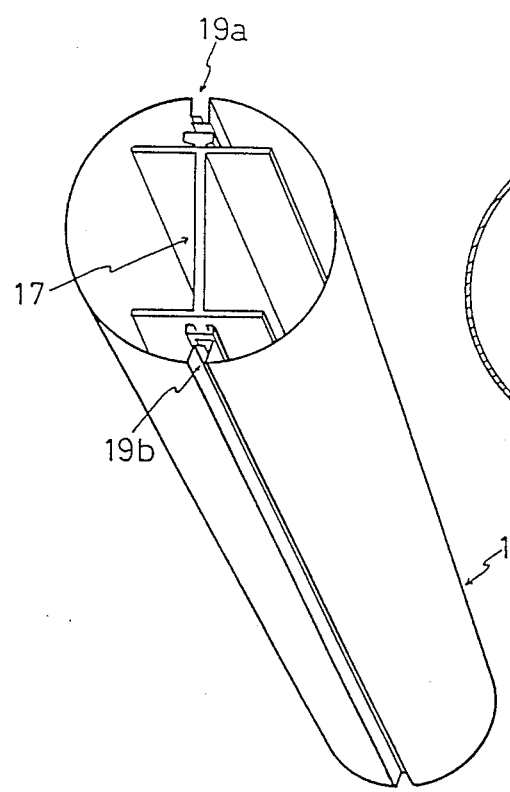
FIG.8
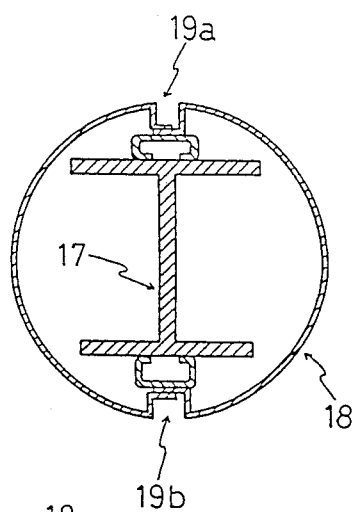
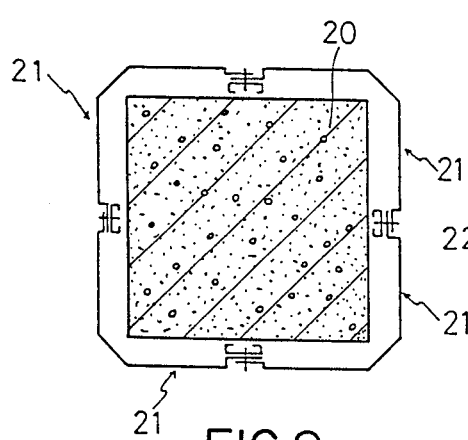
FIG.9
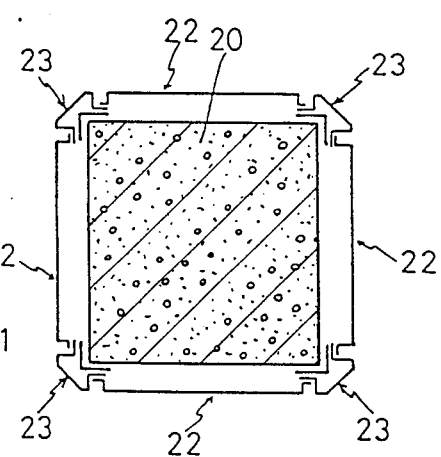
FIG.10

DECORATIVE PANEL AS CONSTRUCTION MATERIAL

FIELD OF THE INVENTION

The present invention relates to a decorative panel as a construction material for use in decorative finish of a building by covering surfaces of walls, pillars, ceilings, floors, doors, handrails, screens and other like parts of the interior and exterior of the building. The panel according to the invention is made of stainless steel, has a beautiful color shade and hardly gets flaws.

BACKGROUND OF THE INVENTION

As construction panels goods manufactured from colored sheets of stainless steel are widely used. Such a panel comprises a sheet of stainless steel having at least one surface, on which a rugged pattern may be optionally put, and a colored coat applied on said surface. The colored panel is used to cover surfaces of walls, pillars, ceilings, floors, doors, handrails, screens and other like parts of the interior and exterior of various buildings and other structures to impart them beautiful appearance and durability.

While decorative panels of stainless steel may be prepared so that they may have any arbitrary size, they normally have a surface area smaller than that of the surface to be covered by them. Namely, a surface of a large area is decorated by attaching thereon a plurality of adjacently arranged modular panels having a small surface area. To facilitate this attachment work each unit panel normally has one or more short bent portions formed along its side edges. Each bent portion usually comprises a side piece of a small width formed by bending the panel along its side approximately perpendicularly from the decorative surface to the back surface, and a flange piece formed by bending the front edge of the side piece at an angle of approximately 90° so that the so formed flange piece is substantially parallel to the decorative surface. Such modular panels are secured on a surface to be decorated by laying a flange piece of one panel on that of another flange piece and fixing the overlapping flange pieces to the surface to be decorated by riveting or other fastening works. Thus, modular decorative panels of stainless steel normally have one or more bent portions where the panel is worked by bending it at an angle of approximately 90° to ensure facilitation and stability of attachment of the panels to a surface to be decorated.

Decorative panels of stainless steel as a construction material have heretofore been prepared by a process in which a sheet of stainless steel is subjected to a chemical formation, painting or plating treatment to form a colored coat on the surface thereof, followed by a bending work as described above.

OBJECT OF THE INVENTION

An object of the invention is to provide a decorative panel as a construction material comprising a sheet of stainless steel having a colored coat on at least one surface of the stainless steel sheet, which is excellent in that the colored coat hardly gets flaws and the color does not change with time, when compared with any known decorative panels of stainless steel having colored coats formed by a chemical formation, painting or plating treatment More particularly, the object of the invention is the provision of a decorative panel as a construction material having a surface color in accordance with a designer's request, said color being more stable, irrespective of it's shade, a coat providing said color more hardly getting flaws, and bent portions of the panel being more resistive against conditions which might deteriorate quality or cause rust, than any known decorative panels of stainless steel having colored coats formed by a chemical formation, painting or plating treatment.

SUMMARY OF THE INVENTION

In accordance with one aspect of the invention, there is provided a decorative panel as a construction material for use in decorative finish of a building by covering surfaces of walls, pillars, ceilings, floors, doors, handrails, screens and other like parts of the interior and exterior of the building, said panel comprising a sheet of stainless steel as a substrate and a colored coat on at least one surface of said substrate and having one or more bent portions where the entire thickness of said substrate and colored coat is unitarily bent at an angle of at least 90°, characterized in that said colored coat has a thickness of not more than 5 $\mu$m, preferably from 0.1 to 3 $\mu$m, and consists essentially of from 30 to 60 atomic % of titanium, from 30 to 60 atomic % of aluminum and such an amount of nitrogen that a ratio N (atomic %)/[Ti (atomic %)+Al (atomic %)] is within the range between 0.6 and 1.0; and said colored coat is applied onto the surface of said substrate by a sputter ion plating process, whereby nitrides of titanium and aluminum are entirely consistently formed to constitute said colored coat.

In accordance with another aspect of the invention, there is provided a decorative panel as a construction material for use in decorative finish of a building by covering surfaces of walls, pillars, ceilings, floors, doors, handrails, screens and other like parts of the interior and exterior of the building, said panel comprising a sheet of stainless steel as a substrate and a colored coat on at least one surface of said substrate and having one or more bent portions where the entire thickness of said substrate and colored coat is unitarily bent at an angle of at least 90°, characterized in that said colored coat has a thickness of not more than 5 $\mu$m, preferably from 0.1 to 3 $\mu$m, and consists essentially of from 30 to 60 atomic % of titanium, from 30 to 60 atomic % of aluminum, such an amount of nitrogen that a ratio N (atomic %)/[Ti (atomic %)+(Al (atomic %)] is within the range between 0.6 and 1.0 and such an amount of carbon that a ratio C (atomic %)/[Ti (atomic %)+Al (atomic %)] is not greater than 0.25; and said colored coat is applied onto the surface of said substrate by a sputter ion plating process, whereby nitrides and carbides of titanium and aluminum are entirely consistently formed to constitute said colored coat.

The colored coat of the decorative panel according to the invention consists essentially of titanium, aluminium and nitrogen, and optionally carbon, and has a particular color in accordance with a particular nitrogen content within the range prescribed above. In other words, the decorative panel according to the invention may have various colors including red, brown, green, blue, violet, gold and others in accordance with the particular nitrogen content in the colored coat. Further, addition of carbon to the colored coat serves to make the color obtained by the particular amount of nitrogen blackish. In contrast to colors of known decorative panels in which colored coats are formed by a chemical formation or painting treatment, a color of the decorative panel according to the invention is not interfered, that is, it does not substantially change with change of the thickness of the colored coat so far as it is 0.1 μm or more in thickness.

DETAILED DESCRIPTION OF THE INVENTION

The decorative panel according to the invention can be prepared by forming a colored coat consisting essentially of titanium, aluminum and nitrogen on at least one surface of a sheet of stainless steel by a sputter ion plating process, and subjecting the sheet having the colored coat so formed to a bend work of an angle of least 90° thereby forming one or more bent portions along at least one side edge of the sheet. The sputter ion plating process can be carried out by a method known per se., using a conventional sputter ion plating apparatus. It has been found that a colored coat having a desired color shade can be formed by using a Ti-Al alloy as a target and adjusting the nitrogen gas concentration of an atmosphere used in the apparatus. The target, for example 50 atomic % Ti-50 atomic % Al alloy may be prepared by hot pressing. The atmosphere in the apparatus can be a mixed gas of nitrogen and argon, and optionally $C_nH_m$ gas, maintained under a reduced pressure of from $10^{-2}$ Torr. to $10^{-4}$ Torr. The target voltage may be maintained from $-150$ V to $-520$ V. The sputter ion plating process is carried out while maintaining the atmosphere in the apparatus at a predetermined reduced pressure by means of a vacuum device and introducing argon and nitrogen (and optionally $C_nH_m$) gases into the apparatus at respectively predetermined flow rates. It has been found that dry coatings of various colors can be formed on the steel sheet substrate by controlling the flow rates of the gases. In cases wherein a Ti-Al alloy is used as a target and an atmosphere of argon and nitrogen gases is maintained in the apparatus, various colors including red, brown, green, blue and violet can be realized by adjusting the concentrations of nitrogen in the atmosphere. In cases wherein a Ti-Al alloy is used as a target and an atmosphere of argon, nitrogen and $C_nH_m$ gases is maintained in the apparatus, various colors mentioned above which are more or less blackish can be realized by adjusting the concentrations of nitrogen and $C_nH_m$ gases in the atmosphere. These colors and shades are completely different from gold colors of dry coatings consisting of titanium nitride and metallic colors (like those of stainless steel) of dry coatings consisting of aluminum nitride, which dry coatings have heretofore been utilized as a decorative overcoat in limited fields such as watch cases decorative accessaries and eye frames.

When the colored coat is applied by a sputter ion plating process using an atmosphere of nitrogen and argon, nitrides of titanium and aluminum are entirely consistently formed to constitute the colored coat essentially consisting of three elements: titanium, aluminum and nitrogen. Whereas when the colored coat is applied by a sputter ion plating process using an atmosphere of nitrogen, argon and $C_nH_m$, nitrides and carbides of titanium and aluminum are entirely consistently formed to constitute the colored coat essentially consisting of four elements: titanium, aluminum, nitrogen and carbon. The coat so formed has various colors depending upon the amounts of titanium nitride and aluminum nitride, amounts of combined nitrogen, and amounts and forms of carbides.

The elementary composition of the colored coat is: from 30 to 60 atomic % of titanium, from 30 to 60 atomic % of aluminum and such an amount of nitrogen that a ratio N (atomic %)/[Ti (atomic %)+Al (atomic %)] is within the range between 0.6 and 1.0, and optionally such an amount of carbon that a ratio C (atomic %)/[Ti (atomic %)+Al (atomic %)] is not greater than 0.25. While dry coatings having other compositions may also be formed by a sputter ion plating process, they do not have esthetic colors as required in decorative panels. It is supposed that particular colors of the coat are attributed to compounds of special compositions locally formed by at least a part of the nitrides and carbides constituting the colored coat.

The decorative panel according to the invention has along its side edges at least one bent portion where it is unitarily bent at an angle of at least 90°. Since the bent portion may constitute a part of decoration, it should preferably have a colored coat as well. It is necessary, therefore, to bend a stainless steel sheet having a colored coat by an angle of at least 90° at portions where the colored coat exists. If cracks penetrating the colored coat are formed upon this bending, they may cause the colored coat to locally peel off at bent corners or make rust to occur in the substrate steel. Accordingly, upon bending work of 90° or more no cracks should be formed in the colored coat that may adversely affect the quality of the decorative panel. It has been found that if the thickness of the colored coat is not more than 5 μm, preferably not more than 4 μm; and more preferably not more than 3 μm, cracks that may pose the problems above are not formed in the colored coat upon bending work of 90° or more. However, with a coat thickness substantially less than 0.05 μm, the coat is not appreciably colored. For these reasons the thickness of the colored coat of the decorative panel according to the invention is normally from 0.05 to 5 μm, preferably from 0.05 to 4 μm, and more preferably from 0.1 to 3 μm.

The substrate of the decorative panel according to the invention can be a sheet of stainless steel of any species. The decorative panel according to the invention having the substrate made of stainless steel is semi-permanently durable. Particularly, even if a back surface of the panel, which is invisible during service of the panel, has no colored coat, it maintains corrosion resistance since it is made stainless steel. Further, sheets of stainless steel generally have beautiful surfaces of good quality when compared with sheets of carbon steel. Accordingly, a product prepared by applying a colored coat onto a surface of a stainless steel sheet according to the invention is more beautiful than a product prepared by applying the same colored coat onto a surface of a carbon steel sheet. Particularly beautiful products are obtainable when sheets of stainless steel have a mirror-finished or hair line-finished surface, and colored coats according to the invention are applied on such a surface. A starting sheet of stainless steel may have a surface on which a rugged pattern has been put by an etching process. When a colored coat according to the invention is applied on such a surface a product having a rugged colored coat is obtained. Adhesion of the colored coat to the substrate is very strong, and even when a decorative panel having a rugged colored coat according to the invention is bent at an angle of 90° or more at portions where the rugged colored coat exists, the adhesion is not substantially impaired, provided that the thickness of the colored coat is not more than 3 μm.

Preferred embodiments of the invention will now be described with reference to the attached drawings.

BRIEF DESCRIPTION OF THE DRAWINGS

FIG. 3 is an enlarged cross-sectional view of a part of the decorated wall shown in FIG. 2;

FIG. 4 is an enlarged view of a joint part A of FIG. 3;

FIG. 5 is a sectional view similar to FIG. 4 showing a modification of a joint part shown in FIG. 4;

FIG. 6 is a cross-sectional view of another example of jointing decorative panels according to the invention;

FIG. 7 is a perspective view of an arrangement of decorative panels according to the invention for decorative finish of a pillar;

FIG. 8 is a transverse cross-sectional view of the decorated pillar shown in FIG. 7;

FIG. 9 is a schematic cross-sectional view of another example of a decorated pillar composed of decorative panels according to the invention;

FIG. 10 is a schematic cross-sectional view of still another example of a decorated pillar composed of decorative panels according to the invention;

PREFERRED EMBODIMENTS OF THE INVENTION

Figure 1:
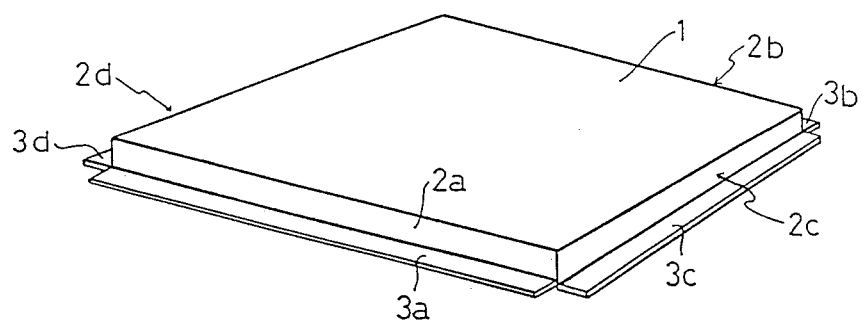
FIG. 1 is a perspective view of a typical decorative panel according to the invention.

FIG. 1 shows a module of the decorative panel according to the invention suitable for use in decorative finish of a relatively large area such as a wall and a ceiling of a building. The panel has a colored coat on the side visible in the figure. The panel shown in FIG. 1 comprises a base plane 1 having a relatively large rectangular surface, side pieces 2a to 2d (of which 2b and 2d are invisible in FIG. 1) of a small width formed by bending the panel along its side approximately perpendicularly from the decorative surface to the back surface, and flange pieces 3a to 3d of a small width formed by outwardly bending front edges of the side pieces 2a to 2d at an angle of approximately 90° so that the so formed flange pieces 3a to 3d are substantially parallel to the base plane 1. The base plane 1, side pieces 2a to 2d and flange 3a to 3d all have the same thickness and comprise a sheet of stainless steel having on one surface thereof a thin dry coated colored coat having a thickness of not more than 5 μm and consisting essentially of nitrides of titanium and aluminum and optionally carbides of titanium and aluminum. In the example illustrated in FIG. 1, the colored coat is applied on the surface which is visible upside in the figure, and the opposite surface of the panel is not covered by the colored coat.

Figure 2:
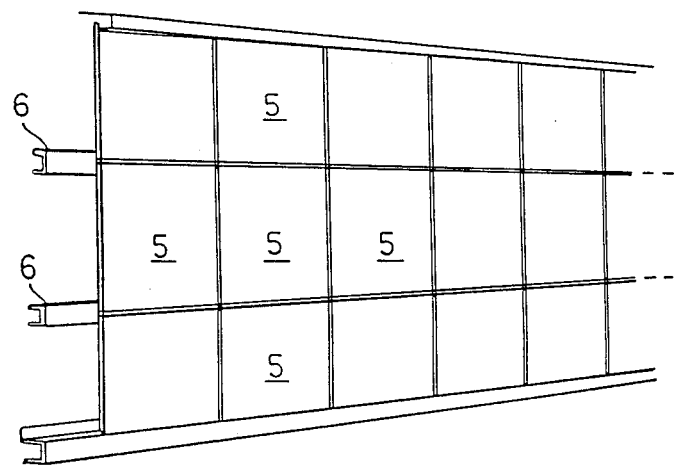
FIG. 2 is a perspective view of an arrangement of the decorative panels shown in FIG. 1 for decorative finish of a wall.

FIG. 2 illustrates use of the modular decorative panels in decorative finish of a wall. As shown in the figure a broad wall is covered by a plurality of the modular panels 5 having the same dimension contiguously arranged aide by side and top to bottom. It is convenient to dispose base beams 6 on the surface of the wall and to joint adjacent panels 5 on the beams 6. More particularly, the base beams 6 are horizontally disposed on the surface of the wall on levels where top or bottom side edges of the panels 5 are to be placed and the panels 5 are fixed of the base beams 6.

FIG. 3 illustrates fixation of the decorative panels 5 on the base beams 6. On the beam 6 horizontally fixed on the surface of a wall 7 at a predetermined level, a bottom flange piece of a panel and a top flange piece of another panel are placed in a overlapping relation and fixed. As best seen from FIG. 4, a flange piece 3a of one panel and a flange piece 3b panel of another panel are superimposed on the beam 6, and the overlapping flange pieces are fixed to the beam 6 by means of a tapping screw 8. The width of a side piece 2a of one panel differs from that of a side piece 2b of the other panel by a length corresponding the thickness of the panels so that both the base planes 1 of the panels may come in one and the same plane. Groove formed by the respective side pieces 2a and 2b and flange pieces 3a, form a pattern on the decorative surface. If desired, a coking 9 may be put in the groove. Instead of the coking 9 a channel 10 having the same colored coat as the base plane 1 has, may be buried in the groove, as shown in FIG. 5. In this case, if the side pieces 2a, 2b have bent from the base plane 1 at an angle slightly in excess of 90° to form a groove with an expanded bottom, the channel 10 is conveniently prevented from falling off from the groove.

FIG. 6 shows another example of jointing decorative panels according to the invention. While the illustrated panel has a bent portion comprising a side piece 2a and a flange piece 3a as in the previous example on one side, it has on the opposite side a different bent portion which has been formed by quadruple 90° bending work. The latter bent portion comprises a first side piece 11b formed by bending the panel along its side from the base plane 1 to the back surface at an angle of 90°, an inwardly bent piece 12b formed by inwardly bending the front edge of the side piece 11b at an angle of 90° so that the so formed piece 12b is parallel to the base plane 1, a second side piece 13b formed by the front edge of the inwardly bent piece 12b at an angle of 90° so that the so formed second side piece 13b is parallel to the first side piece 11b, and a flange piece 14b formed by bending the front edge of the second side piece 13b at an angle of 90° so that the so formed flange piece 14b is parallel to the base plane 1. The flange piece 14b extends beyond the side piece 11b, and a clearance between the the flange piece 14b and the inwardly bent piece 12b is the same as or slightly larger than the thickness of the panel. The decorative panels of such a structure can be easily laid on a wall or ceiling without substantially forming grooves between adjacent panels as is the case with the previous example. Namely, as shown in FIG. 6, the flange piece 14b of one panel is fixed to a base plate 15 by means of a screw 16. Since the flange piece 14b is extending beyond the side piece 11b, it can be fixed on that extending part. Into the clearance between the flange piece 14b and the inwardly bent piece of the fixed panel, the flange piece 3a of another panel is inserted in a direction shown by an arrow in FIG. 6 so that the side piece 11b of one panel and the side piece 2a of the other panel may be jointed without clearance between them.

As seen from the examples above, the decorative panel according to the invention for decorative finish of flat surfaces such as walls and ceilings has along its sides bent portions where it is bent at an angle of 90° or more, and has a dry coated colored coat over its outer surface including the bent portions.

FIGS. 7 and 8 illustrate an example in which an I-shaped steel pillar 17 is covered with decorative panels 18 according to the invention. In this example again, the panel 18 has bent portions 19a and 19b where it is bent an angle of 90° along its sides as in the previous examples. Each bent portion comprises a side piece and a flange piece as hereinbefore described with reference to FIGS. 4 and 5.

FIG. 9 illustrates an example in which a square concrete pillar 20 is covered with four curved decorative panels 21 of the same shape according to the invention. Whereas FIG. 10 illustrates an example in which the pillar 20 is covered with four flat decorative panels 22 of the same shape according to the invention and with four decorative panels 23 for corner finish of the same shape according to the invention. It will be understood that each of the decorative panels 21, 22 and 23 has bent portions where it is bent an angle of 90° along its side and each bent portion comprises a side piece and a flange piece as hereinbefore described with reference to FIGS. 4 and 5.

Figure 11:
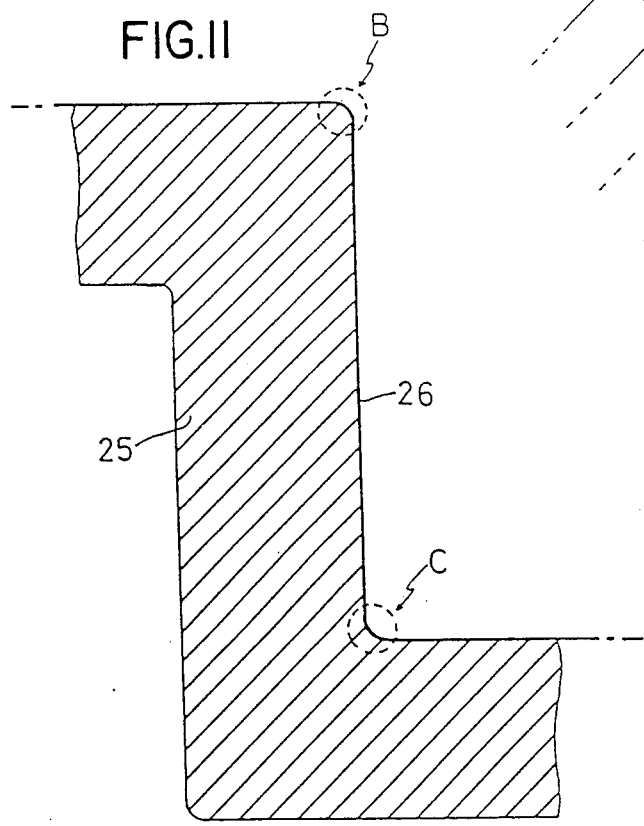
FIG. 11 is an enlarged cross-sectional view of a bent portion of a decorative panel according to the invention.
Figure 12:
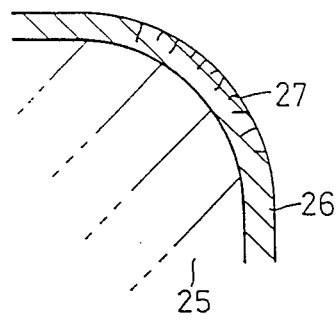
FIG. 12 is an enlarged view of a part B of FIG. 11.
Figure 13:
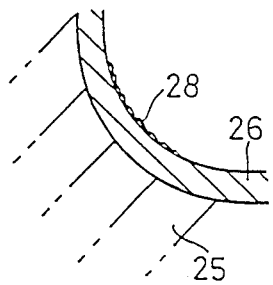
FIG. 13 is an enlarged view of a part C of FIG. 11.

FIG. 11 is an enlarged cross-sectional view of a bent portion of a decorative panel according to the invention. In FIG. 11, the reference numeral 25 designates a substrate which is a sheet of stainless steel, while the reference numeral 26 designates a colored coat. The panel comprising the stainless steel sheet substrate 25 having the colored coat 26 on one surface is subjected to the bending work of an angle of 90°. In FIG. 11, a bent part where the colored coat comes on an outer corner is shown by B, whereas a bent part where the colored coat comes on an inner corner is shown by C. FIGS. 12 and 13 are diagrammatic enlarged cross-sectional views of the parts B and C, respectively. In the part B, since a tensile stress acts on the colored coat 26, fine cracks are liable to occur in the colored coat 26, as shown in FIG. 12. Whereas in the part C, since a compressive stress acts on the colored coat 26, fine wrinkles are liable to occur in the colored coat 26 which may cause the coat to peel off.

We carried out many experiments in which decorative panels according to the invention were outwardly and inwardly bent at an angle of 90° using a punch and dice. In these experiments, panels of a SUS 304 sheet of a thickness of 1.5 mm having a colored coat of various thickness were tested by covering each panel with a vinyl sheet and bending the assembly so constructed by an angle of 90° at a curvature of 3 mm. In cases wherein the thickness of the colored coat was not more than 3 $\mu$m, occurrence of cracks reaching the substrate and peeling of the colored coat were not observed. Further, outwardly and inwardly bent parts of the samples were subjected to a peeling test using an adhesive tape and to a corrosion test. It was found that provided that the thickness of the colored coat was not more than 3 $\mu$m, those bent parts were as satisfactory as comparable bent parts of painted and chemically formed products having a colored coat of good elongation.

Typical examples of decorative panels according to the invention we prepared will now be described.

A bright anneal finished sheet of SUS 304 having a thickness of 1.5 mm and an area of 300 mm×300 mm was degreased, washed and set in a sputter ion plating apparatus having an inner volume of a length of 2880 mm, a height of 1130 mm and a width of 182 mm. A colored coat of a thickness of about 0.3 $\mu$m was formed on the surface of the stainless steel sheet using a 50% Ti-50% Al alloy as a target, maintaining a vacuum of about $2\times10^{-4}$ Torr. in the apparatus, feeding argon at a constant flow rate of 240 ml/min. and nitrogen at a constant flow rate which was varied within the range from 20 to 200 ml/min. and with an alternate target voltage of $-520$ V. Besides, an example in which a $C_nH_m$ gas was fed at a flow rate of 25 ml/min. was carried out as well.

Figure 14:
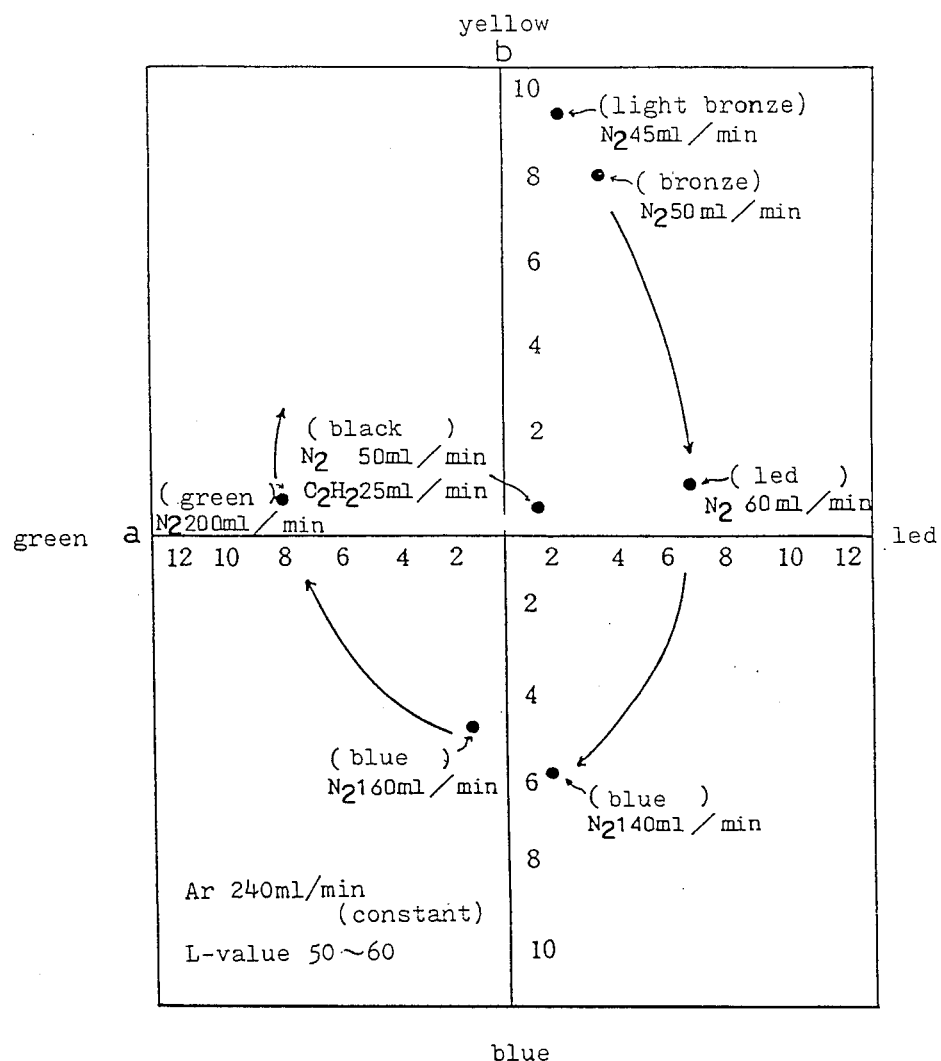
FIG. 14 illustrates a relationship between the color of the coat formed and the flow rates of nitrogen and hydrocarbon gases introduced into a sputtering atmosphere upon application of colored coats by a sputter ion plating process.

The dry coats so obtained were tested for the color shade using a color analyzer SM-4 supplied by SUGA Tester Co., Ltd. The results obtained (relationship between the nitrogen flow rate and the color) are shown in FIG. 14 in which the values a, b and L are in accordance with Hunter's method for expression of color differential and the L value is from 50 to 60. Color measurement was carried out on ten points chosen at random within the area of 300 mm×300 mm. The color differentials of two of the ten points were within the range of ±0.5.

As seen from FIG. 14, various colors including bronze, red, blue and green were obtained depending upon the nitrogen flow rate. When the $C_nH_m$ gas was additionally used a black color was obtained. Besides the typical examples above, we prepared various colored panels while more precisely adjusting the nitrogen flow rate and found that almost colors could be realized by simply adjusting the flow rate of nitrogen (or the flow rates of nitrogen and $C_nH_m$ gas) according to the process described herein.

Each colored panel was worked by bending along its sides at a curvature of 3 mm by an angle of 90° to provide a decorative panel according to the invention as shown in FIG. 1. In the colored coat on both the inwardly and outwardly bent parts no cracks reaching the substrate were observed.

The decorative panels so prepared were further tested for discoloration at an elevated temperature, wear resistance and adhesion of fingerprints.

According to results of the test for discoloration at an elevated temperature, the bronze colored product was the best. It was not discolored after it had been heated in air at a temperature of 500° C. for a period of 20 hours. The black colored product was the worst in this test. Nevertheless, it was not discolored by one hour heating in air at 500° C. After 20 hours heating at 500° C. it was slightly faded. Other products were estimated as being intermediate.

In the test for wear resistance, the base plane of each product was rubbed 100 times #400 or #500 SiC sand paper under a load of 200 gf. In all instances no visible defects were formed, Although the blue colored product had appeared slightly impaired when compared with the black and brown ones, it was not distinct.

In the test for adhesion of fingerprints, five persons' fingers were pressed against the surface of the samples to be tested and the distinctiveness of the fingerprints was estimated. No difference in the distinctness of the fingerprints was observed between the differently colored samples. The fingerprints were readily removed by wiping with a dry cloth. Incidentally, it was found that fingerprints were less distinctive with a product having hair line finished SUS 304 as a substrate than with a product having mirror finished SUS 304 as a substrate.

We claim:

1. A decorative panel as a construction material for use in decorative finish of a building by covering surfaces of walls, pillars, ceilings, floors, doors, handrails, screens and other like parts of the interior and exterior of the building, said panel comprising a sheet of stainless steel as a substrate and a colored coat on at least one surface of said substrate and having one or more bent portions where the entire thickness of said substrate and colored coat is unitarily bent at an angle of at least 90°, wherein said colored coat has a thickness of not more than 5 μm and consists essentially of from 30 to 60 atomic % of titanium, from 30 to 60 atomic % of aluminum and such an amount of nitrogen that a ratio N (atomic %)/[Ti (atomic %)+ Al (atomic %)] is within the range between 0.6 and 1.0, the total sum of the Ti (atomic %), Al (atomic %) and N (atomic %) being substantially 100; and said colored coat is applied onto the surface of said substrate by a sputter ion plating process, whereby nitrides of titanium and aluminum are entirely consistently formed to constitute said colored coat.

2. The decorative panel in accordance with claim 1 wherein said colored coat has a thickness of from 0.1 μm to 3 μm.

3. The decorative panel in accordance with claim 1 wherein said sheet of stainless steel has a surface on which a rugged pattern is put, and said colored coat is applied on said surface.

4. The decorative panel in accordance with claim 1 wherein said sheet of stainless steel has a mirror-finished surface, and said colored coat is applied on said surface.

5. A decorative panel as a construction material for use in decorative finish of a building by covering surfaces of walls, pillars, ceilings, floors, doors, handrails, screens and other like parts of the interior and exterior of the building, said panel comprising a sheet of stainless steel as a substrate and a colored coat on at least one surface of said substrate and having one or more bent portions where the entire thickness of said substrate and colored coat is unitarily bent at an angle of at least 90°, wherein said colored coat has a thickness of not more than 5 μm and consists essentially of from 30 to 60 atomic % of titanium, from 30 to 60 atomic % of aluminum and such an amount of nitrogen that a ratio N (atomic %)/[Ti (atomic %)+Al (atomic %)] is within the range between 0.6 and 1.0 and such an amount of carbon that a ratio C (atomic %)/[Ti (atomic %)+Al (atomic %)] is not greater than 0.25, the total sum of the Ti (atomic %), Al (atomic %) and N (atomic %) and C (atomic %) being substantially 100; and said colored coat is applied onto the surface of said substrate by a sputter ion plating process, whereby nitrides and carbides of titanium and aluminum are entirely consistently formed to constitute said colored coat.

6. The decorative panel in accordance with claim 5 wherein said colored coat has a thickness of from 0.1 μm to 3 μm.

7. The decorative panel in accordance with claim 5 wherein said sheet of stainless steel has a surface on which a rugged pattern is put, and said colored coat is applied on said surface.

8. The decorative panel in accordance with claim 5 wherein said sheet of stainless steel has a mirror-finished surface, and said colored coat is applied on said surface.

* * * * *